United States Patent
Pachamuthu et al.

(10) Patent No.: US 11,037,631 B2
(45) Date of Patent: Jun. 15, 2021

(54) COLUMN ERASING IN NON-VOLATILE MEMORY STRINGS

(71) Applicant: SanDisk Technologies LLC, Addison, TX (US)

(72) Inventors: Jayavel Pachamuthu, San Jose, CA (US); Amul Dhirajbhai Desai, Milpitas, CA (US); Ankitkumar Babariya, San Jose, CA (US)

(73) Assignee: Sandisk Technologies LLC, Addison, TX (US)

( * ) Notice: Subject to any disclaimer, the term of this patent is extended or adjusted under 35 U.S.C. 154(b) by 0 days.

(21) Appl. No.: 16/252,300

(22) Filed: Jan. 18, 2019

(65) Prior Publication Data

US 2020/0013469 A1    Jan. 9, 2020

Related U.S. Application Data

(60) Provisional application No. 62/694,866, filed on Jul. 6, 2018.

(51) Int. Cl.
| | | |
|---|---|---|
| *G11C 16/04* | (2006.01) | |
| *G11C 16/16* | (2006.01) | |
| *G11C 16/34* | (2006.01) | |

(52) U.S. Cl.
CPC .......... *G11C 16/16* (2013.01); *G11C 16/0483* (2013.01); *G11C 16/3427* (2013.01)

(58) Field of Classification Search
CPC .................................................. G11C 16/0483
USPC .................................................. 365/185.17
See application file for complete search history.

(56) References Cited

U.S. PATENT DOCUMENTS

| | | |
|---|---|---|
| 5,790,464 A | 8/1998 | Roh et al. |
| 6,426,898 B1 | 7/2002 | Mihnea et al. |
| 6,535,432 B2 | 3/2003 | Yen et al. |
| 6,614,693 B1 | 9/2003 | Lee et al. |
| 7,403,428 B2 | 7/2008 | Higashitani |
| 7,630,244 B2 | 12/2009 | Lee |
| 8,824,211 B1 | 9/2014 | Costa et al. |
| 9,218,874 B1 | 12/2015 | Koh et al. |
| 9,922,705 B1 | 3/2018 | Diep et al. |
| 9,984,760 B1 | 5/2018 | Zhang et al. |
| 2013/0329496 A1* | 12/2013 | Lee ............... G11C 16/3445 365/185.11 |
| 2017/0178736 A1* | 6/2017 | Yang ............... G11C 11/5628 |

(Continued)

*Primary Examiner* — Hoai V Ho
(74) *Attorney, Agent, or Firm* — Volpe Koenig

(57) ABSTRACT

Strings of non-volatile memory cells include one or more joint regions adjacent to dummy non-volatile memory cells. During erase operations, different voltage levels are used for different dummy word lines coupled to respective dummy non-volatile memory cells. For example, a selection circuit may set a voltage level of a particular dummy word line to a voltage level greater than a different dummy word line. In another example, the selection circuit may determine a voltage level for a given dummy word line based on a distance between a non-volatile memory cell coupled to the given dummy word line and a selection device included in a string of non-volatile memory cells. Electron holes generated using the dummy word lines during erase operations may neutralize undesired trapped charges in a non-volatile memory string, thereby reducing disparity in erase times for different strings in the non-volatile memory circuit.

19 Claims, 12 Drawing Sheets

(56) References Cited

U.S. PATENT DOCUMENTS

2017/0287566 A1 10/2017 Sabde et al.
2018/0075919 A1* 3/2018 Pang .................. G11C 16/0466

* cited by examiner

COLUMN ERASING IN NON-VOLATILE MEMORY STRINGS

PRIORITY INFORMATION

The present application claims benefit of priority to U.S. Provisional Patent Application No. 62/694,866, entitled "COLUMN ERASING IN NON-VOLATILE MEMORY STRINGS," filed Jul. 6, 2018.

BACKGROUND

Technical Field

This disclosure relates generally to non-volatile memory circuits, and more particularly, to erasing non-volatile memory cells.

Description of the Relevant Art

Computer systems include processors and multiple memory circuits that store software programs or applications, as well as data being operated on by the processors. Such memories may vary in storage capacity as well as access time. In some computing systems, memories may be arranged in a hierarchical fashion, with smaller, faster memory circuits coupled directly to the processors, and larger, slower memory circuits coupled to the processors via a memory controller communicating with the processors via a communication link.

The memory circuits included in computer systems may be volatile or non-volatile. Volatile memory circuits require application of power in order to maintain previously stored data. Once power is removed from a volatile memory, previously stored data is lost. Non-volatile memory circuits, however, have the ability to maintain previously stored data in the absence of power.

In many cases, volatile memory circuits are higher performing (e.g., have faster access times) than non-volatile memory circuits. Volatile memory also typically permits a greater amount of repeated data storage operations than non-volatile memory circuits. As such, volatile memory circuits are often better suited to main or cache memory applications within a computer system, while non-volatile memory circuits are generally employed for secondary or long-term storage due to their lower performance resulting from challenges in sensing data store in non-volatile memory cells.

Non-volatile memory circuits may use one of various non-volatile storage cells, such as flash cells, phase-change cells, ferroelectric cells, magnetoresistive cells, and the like. Such cells are programmed using a variety of techniques to adjust electrical or physical properties to encoded one or more data bits. The non-volatile data storage cells may be arranged in various cell array topologies. For example, the non-volatile storage cells may be arranged in a planar NAND string architecture, a three-dimensional NAND string architecture, a cross point architecture, or any other suitable architecture.

SUMMARY

Various embodiments of a non-volatile memory circuit are disclosed. Broadly speaking, an apparatus and a method are contemplated in which multiple NAND strings that includes a NAND string that is coupled to a source line, and including a plurality of non-volatile memory cells, multiple joint regions interspersed between groups of the non-volatile memory cells, and multiple dummy memory cells. A selection circuit is configured to set multiple dummy word lines, each coupled to a respective dummy non-volatile memory cell, to respective voltage levels in response to an erase command. In one embodiment, the selection circuit is further configured to select a voltage level for a particular dummy word line based on a distance from a corresponding dummy non-volatile memory cell coupled to the particular dummy word line to a selection device included in the NAND string that is coupled to a bit line. By using the dummy word lines in this fashion during erase operations, adequate electron holes may be generated to reduce disparity in erase times for different NAND strings in the non-volatile memory circuit.

Figure 1:
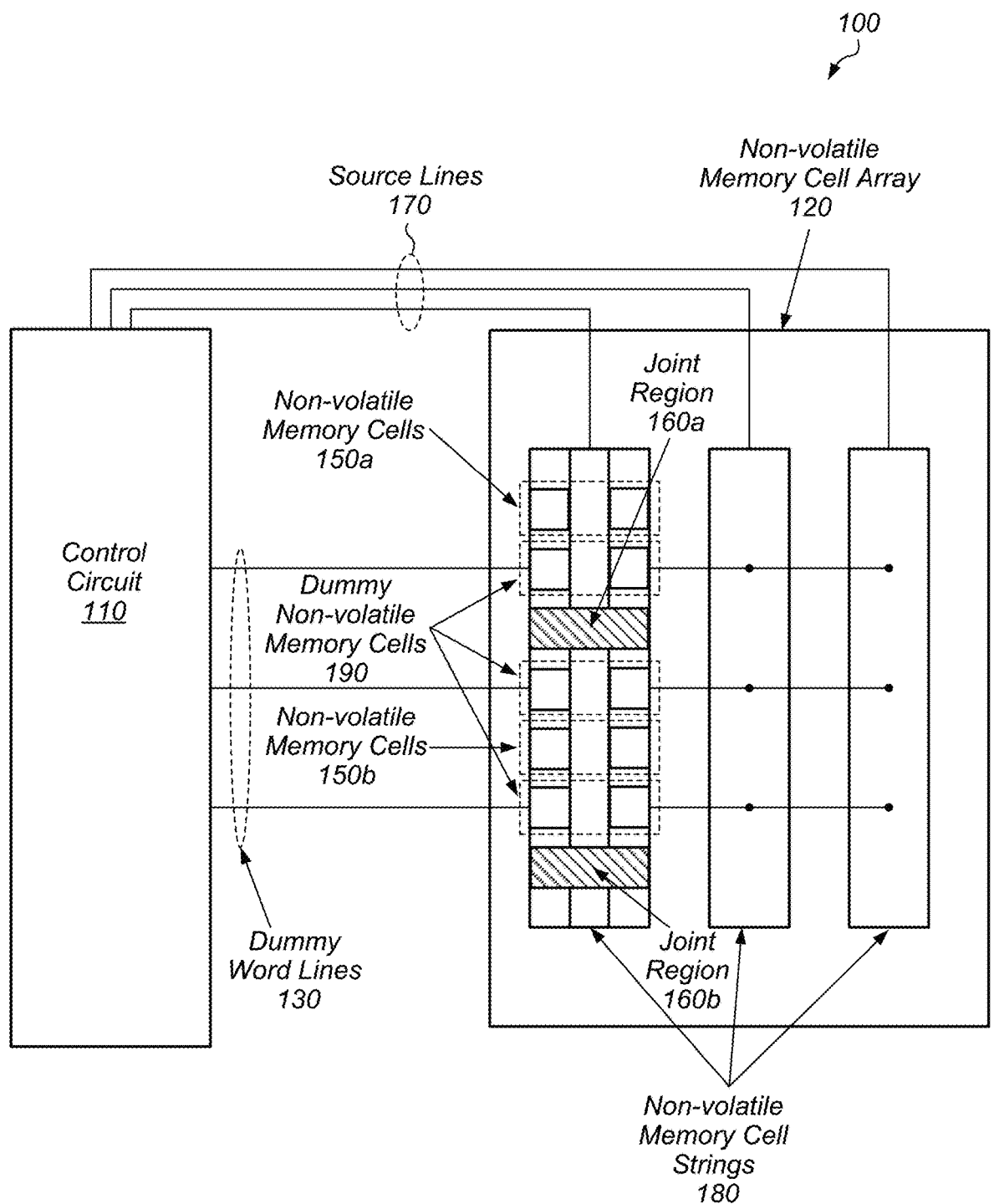
FIG. 1 is a generalized block diagram depicting an embodiment of a non-volatile memory circuit.

While the disclosure is susceptible to various modifications and alternative forms, specific embodiments thereof are shown by way of example in the drawings and will herein be described in detail. It should be understood, however, that the drawings and accompanying detailed description are not intended to limit the disclosure to the particular form illustrated, but on the contrary, the intention is to cover all modifications, equivalents and alternatives falling within the spirit and scope of the present disclosure, including those defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Some non-volatile memory architectures, e.g. NAND flash architectures, employ three-dimensional strings of serially connected non-volatile memory cells that are coupled to respective bit lines and source lines using selection gates. Due to limits in semiconductor manufacturing, some of these three-dimensional strings of non-volatile cells are constructed using multiple tiers of serially connected sets of non-volatile memory cells. Such tiers are connected together using a joint structure (or simply a "joint"). While such joint structures alleviate some manufacturing concerns, they present other difficulties with the operation of the non-volatile memory.

During erase operations in non-volatile memories, voltage levels of word lines, bit lines, and sources lines are set to respective levels in order to generate holes that can recombine with trapped electrons in the non-volatile memory cells, thereby resetting threshold voltages of the non-volatile memory cells to an erased state. As used herein, an electron hole (or simply a "hole") is a lack of an electron where an electron could exist in either an atom or atomic lattice. Certain regions, e.g., the aforementioned joint structures, however, may also trap electrons which recombine, with the holes generated during erase operations, thereby reducing the available pool of holes available for recombination with electrons trapped in non-volatile memory cells.

This reduction in available holes, can result in disparity in erase times, i.e., a number of erase loop cycles, for different non-volatile memory cells within a non-volatile memory string. Moreover, the difference in number of erase loop cycles may result in a reduction in performance due to additional erase loops, as well as generating additional erase stress on some non-volatile memory cells, which may adversely affect reliability of the non-volatile memory cells. The disclosed embodiments are designed to remediate the effects of the erase disparity for both multi-tier and jointless non-volatile memory strings, while maintaining desired performance goals and reliability levels.

An embodiment of a non-volatile memory circuit is illustrated in FIG. 1. As illustrated, non-volatile memory circuit 100 includes non-volatile memory cell array 120 and control circuit 110.

Non-volatile memory cell array 120 includes non-volatile memory cell strings 180. As illustrated, one of non-volatile memory cell strings 180 includes non-volatile memory cells 150a and 150b, joint regions 160a and 160b, and dummy non-volatile memory cells 190, which are adjacent to joint regions 160a and 160b. For purposes of this disclosure, a dummy non-volatile memory cell is considered to be "adjacent" to a joint region because there are no other non-volatile memory cells between the dummy non-volatile memory cell and the joint region. It is noted that although only two joint regions are depicted in embodiment illustrated in FIG. 1, in other embodiments, more than two joint regions may be employed within a particular non-volatile memory cell string.

Each of non-volatile memory cells 150a and 150b are particular examples of non-volatile storage devices. In some cases, stored information may be encoded as a threshold voltage for a given on of non-volatile memory cells 150a and 150b, which can be set by control circuit 110. Prior to storing information in a particular one of non-volatile memory cells 150a and 150b, the respective threshold voltages of non-volatile memory cells 150a and 150b must be reset to a voltage level at or near ground potential.

The process of resetting the threshold voltage of a non-volatile memory cell is commonly referred to as erasing. In some embodiments, to erase a non-volatile memory cell, holes are generated in a channel coupled the non-volatile memory cells. The holes recombine with charge carriers trapped in a charge trap layer in the non-volatile memory cells, thereby resetting the threshold voltage of the non-volatile memory cell. In some cases, erasing a non-volatile memory cell may be an iterative process in which holes are generated to recombine with the trapped charge carriers, followed by a verification operation to determine if the threshold voltage of the non-volatile memory cell has been reset. If the threshold voltage of the non-volatile memory cell has not achieved the erase level, additional erase operations may be performed.

As noted above, a string of non-volatile memory cells may include multiple joint regions. When a regular structure, such as a memory cell array or string of non-volatile memory cells, is broken or ends (e.g., strapping regions within a memory array or a last row or column within a memory array), the change in exposure between the regular structure and the break may result in lithographic differences in memory cells that are adjacent to the break or end of the regular structure. Such lithographic differences may result in variations in the electrical characteristics, which may be undesirable for storing data. To combat this problem, some memory circuit designs employ the use of dummy memory cells that are adjacent to a break or end of a regular structure in the memory array. For example, in the present embodiment, dummy non-volatile memory cells 190 are adjacent to joint regions 160a and 160b. Such dummy non-volatile memory cells are not used for storing data as their electrical characteristics may be different than non-volatile memory cells 150a-150b.

During normal operation of a non-volatile memory circuit, joint regions included in a string of non-volatile memory cells may trap charge carriers (e.g., electrons) in a similar fashion to the non-volatile memory cells. Charge carriers trapped in a joint region may recombine with holes generated during an erase operation, thereby reducing a number of available holes for erasing non-volatile memory cells in the string. Such a reduction in the number of available holes may result in additional erase-and-verify cycles in order to get non-volatile memory cells fully erased, which increases erase time and negatively impacts performance.

Different techniques may be employed to remediate the effects of undesired trapped charges. For example, consider an embodiment in which it is desired to erase a plurality of NAND strings that each include a plurality of dummy non-volatile memory cells and a joint region positioned between ends of a given one of the NAND strings. In such an embodiment, in response to an erase command, control circuit 110 may be configured to set a plurality of dummy word lines coupled to the plurality of dummy non-volatile memory cells to respective voltage levels, where each of the plurality of dummy word lines is coupled to a respective one of the plurality of dummy non-volatile memory cells. By applying such voltage levels to the dummy word lines, additional holes may be generated near the joint regions, thus allowing any trapped charge carriers to be recombined without reducing a number of holes available for erasing the non-volatile memory cells. In some cases, control circuit 110 is also configured to select a voltage level for a particular dummy word line based on a distance from a corresponding dummy non-volatile memory cell coupled to the particular dummy word line to a selection device included in the NAND string, wherein the selection device is coupled to a bit line. Selection devices are employed in NAND strings to selectively couple particular ones of multiple NAND strings to amplifiers or other circuits used in sensing or reading data from the non-volatile memory cells included in the NAND strings. By selectively coupling NAND strings in this fashion, the amplifiers and other circuits may be shared between multiple NAND strings, thereby saving circuit area and reducing power dissipation.

As previously mentioned, different dummy word lines may be set to different voltage levels during an erase operation. In some cases, the voltage level of a particular dummy word line may be set based on previously programmed data bits associated with the particular dummy word line. Such data bits may be stored in any suitable storage element, including a register in a decoder circuit, and are "associated with" a particular dummy word line by information available during the accessing of the particular dummy word line. For example, certain address bits of the dummy word line may be used to look up a location in a storage element that encodes information pertaining to the voltage level of that dummy word line. In various embodiments, the data bits may encode a voltage level to which a particular dummy word line should be set during an erase operation. Alternatively, the data bits may encode a distance from a particular dummy word line to a selection device of the NAND string. Such distance information may be used to determine the voltage level for the particular dummy word line during an erase operation. In some cases, upon reading the data bits from the register, the data bits may be decoded in order to retrieve the voltage level information. For example, to select the voltage level for the particular dummy word line, the control circuit is also configured to decode a plurality of data bits associated with the particular dummy word line. In some cases, the control circuit is configured to set a plurality of word lines to a particular voltage level greater than each of the respective voltage levels, where each of the plurality of word lines is coupled to a respective one of the plurality of non-volatile memory cells.

Another technique that may be employed to recombine charge carriers trapped in the joint regions or elsewhere in a string of non-volatile memory cells includes performing an additional cycle prior to an erase-and-verify loop in response to an erase command. The additional cycle (referred to herein as a "pre-erase cycle") employs various voltage levels of the word lines, dummy word lines, selection lines (collectively "control lines"), as well as a source line coupled to the string, to generate holes for recombination with charge carriers trapped in the string. For example, in one embodiment, the control circuit is configured, prior to setting the plurality of dummy word lines to the respective voltage levels: float each of the plurality of word lines and each of the plurality of dummy word lines. The control circuit is further configured to float first and second control lines coupled to a select gate drain device and a select gate source device, respectively, where the select gate drain device is coupled to a bit line coupled to the NAND string, and the select gate source device is coupled to a different select gate source device. Additionally, the control circuit is configured to set a voltage level of a third control line coupled to the different select gate source device to a given voltage level, wherein the different select gate source device is coupled to the source line.

In cases where the control circuit is configured to float the plurality of word lines and dummy word lines prior to setting the plurality of word lines to the respective voltage levels, the control circuit is also configured, after a period of time has elapsed since the plurality of word lines were floated, to set the plurality of word lines and the plurality of dummy word lines to ground.

As described above, non-volatile memory strings include multiple serially connected transistors (also referred to herein as gates), each of which can be programmed to store one or more data bits. Such non-volatile memory strings may be constructed in various ways. In some cases, the serially connected transistors are fabricated on the surface of a silicon substrate in a planar fashion. Alternatively, the serially connected devices may be fabricated in a stack extending vertically from the surface of the silicon substrate. Non-volatile memory strings fabricated as stacks extending from the substrate are commonly referred to as "3D NAND strings."

Figure 2:
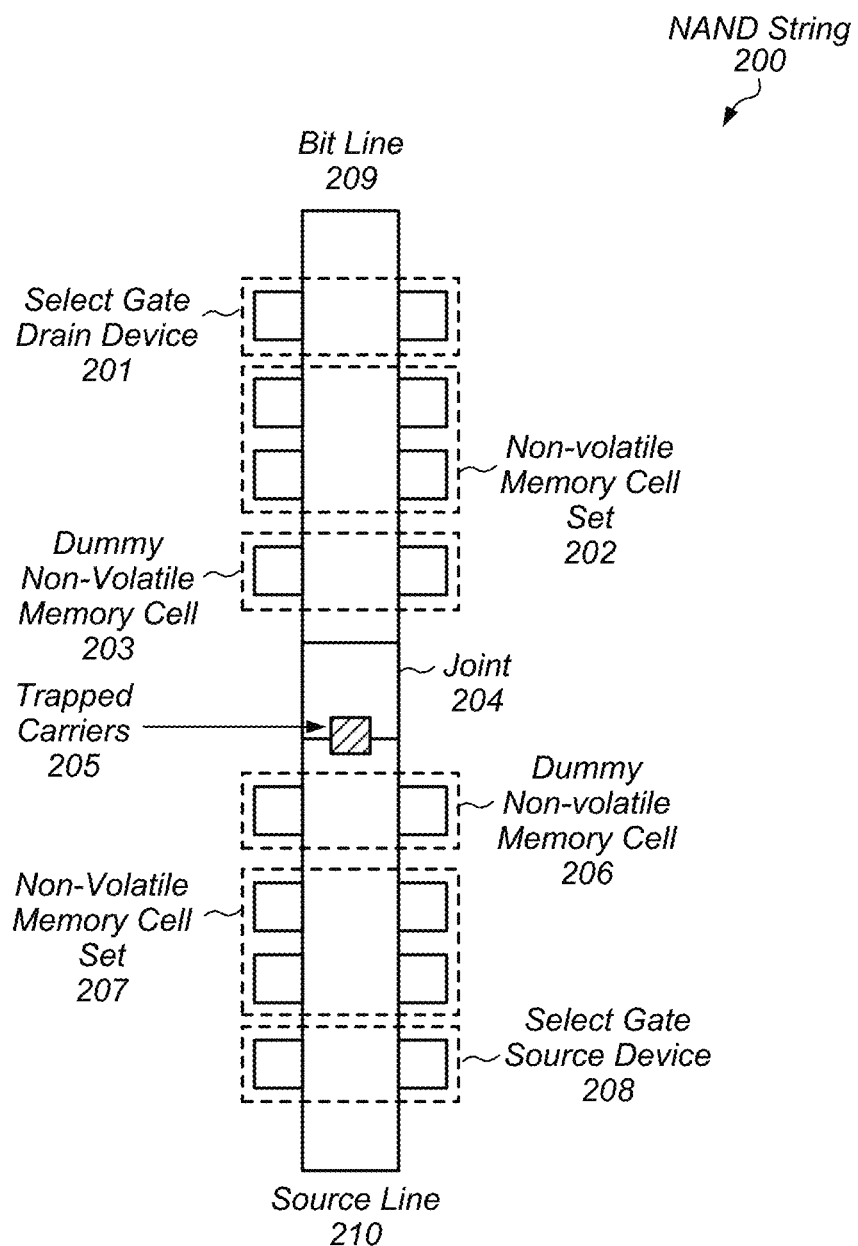
FIG. 2 is a block diagram illustrating an embodiment of a non-volatile memory circuit NAND string that includes joint regions.

A cross-section of a 3D NAND string is illustrated in FIG. 2. As illustrated, NAND string 200 includes select gate drain device 201, non-volatile memory cell set 202, dummy non-volatile memory cell set 202, dummy non-volatile memory cells 203 and 206, joint region 204. Select gate drain device 201 is coupled to bit line 209 and select gate source device 208 is coupled to source line 210.

As described below, non-volatile memory cell sets 202 and 207 include respective sets of non-volatile memory devices. Each of the non-volatile memory cells are configured to store one or more bits of data as an electrical characteristic of the non-volatile memory cells. Moreover, each of the non-volatile memory cells may be particular examples of charge trap devices that can trap charge carriers (e.g., electrons) in an insulator layer commonly referred to as a charge trap layer. At any particular point in time, a threshold voltage for the non-volatile memory cell device is determined by the number of charge carriers trapped within the device. During operation, erase and program operations can remove trapped carriers or increase the number of trapped carriers, thereby changing the threshold voltage of the non-volatile memory cell device. As used herein, a threshold voltage refers to a voltage level applied to a control terminal of a non-volatile memory cell device that enables conduction through the non-volatile memory device. When the voltage level applied to the control terminal of the non-volatile memory cell is less than the threshold voltage, conduction through the non-volatile memory cell is prevented.

As described below, control terminals of select gate drain device 201, non-volatile memory cell set 202, dummy non-volatile memory cell set 202, and dummy non-volatile memory cells 203 and 206, are coupled to respective control signals that are used to activate and program the individual devices.

During manufacture of NAND string 200, metal layers, separated by insulating layers, are deposited and etched to form the aforementioned control signal. Physical holes may then be etched (as distinguished from electron holes which are generated within a semiconductor lattice using different electric potentials) at locations where NAND strings are to be formed. As described in more detail below, various materials may be deposited into the physical holes to form the various components which form the non-volatile memory devices, select gates, and the like.

In some cases, there is a practical limit to how deep a physical hole can be etched for a NAND string, thereby limiting the number of non-volatile memory cells included in such a NAND string. To extend the number of non-volatile memory cells in a NAND string beyond this limit, joint regions (e.g., joint region 204) may be introduced during the manufacture of NAND strings. A joint region separates a portion (commonly referred to as a "tier") of non-volatile memory cells. Non-volatile memory cells, along with their respective control lines included in a particular tier, are completely formed before the deposition of the joint region and before the manufacture of the next tier continues. Once the particular tier has been fabricated, the deposition of the control line metal begins, followed by the etching of new physical holes for the non-volatile memory cells to be included in the next tier. The etching of the new physical holes stops at the previous fabricated joint region. By fabricating multiple tiers atop each other, NAND strings with larger number of non-volatile memory cells may be realized.

To limit the effect on the electrical characteristics of non-volatile memory cells adjacent to a joint region, dummy non-volatile memory cells (e.g., dummy non-volatile memory cells 203 and 206) may be fabricated. Such dummy non-volatile memory cells are not used for data storage; accordingly, any variation in their electrical characteristics due to their adjacency to a joint region does not impact data storage or performance of the non-volatile memory circuit.

While the joint regions allow for the creation of NAND strings that include large numbers of non-volatile memory cells, the joint regions can also affect the electrical characteristics of a NAND string. In some cases, during programming operations of non-volatile memory cells included in a NAND string, carriers may become trapped in and around a joint region (e.g., trapped carriers 205). A similar phenomenon can occur in other areas of the NAND string. For example, in some cases, carriers may become trapped near the connect of the NAND string to the source line. In some cases, the location of a particular NAND string within a non-volatile memory cell array may impact how susceptible the particular NAND string is to unwanted trapped charge carriers. For example, in some non-volatile memory cell circuits, NAND strings located on or near the perimeter of the non-volatile memory cell array may be more susceptible to trapping charge carriers in unwanted locations.

During erase operations, voltage levels of the control signals, as well as a channel connecting the non-volatile memory cells to each other and bit line 209 and source line 210, are set to draw trapped charge carriers from programmed non-volatile memory cells into the channel, where they are recombined with generated holes. Any carriers trapped in a joint region or elsewhere within the NAND string can recombine with the generated holes, limiting the number of holes available to recombine with trapped carriers in the non-volatile memory cells, which limits the efficiency of erase operations.

As mentioned above, and described below in more detail, various techniques may be employed to improve the efficiency of erase operations. In some embodiments, a pre-erase cycle may be used, during which some of the charge carriers trapped in joint regions or other desirable locations are recombined. When the primary erase operation is performed, adequate holes may then be available to recombine with the carriers trapped in the non-volatile memory cells, thereby resetting their respective threshold voltages. In other embodiments, different voltage levels may be applied to the control terminals of dummy non-volatile memory cells 203 and 206. The voltage level applied to a particular non-volatile memory cell may depend on a distance from the particular dummy non-volatile memory cell from source line 210. By applying different voltage levels to the dummy non-volatile memory cells, an increased number of holes may be generated near the joint regions. This allows the recombination of any trapped carriers in or near such joint regions, which may leave more holes available for recombination with the trapped charge carriers in the non-volatile memory cells.

Figure 3:
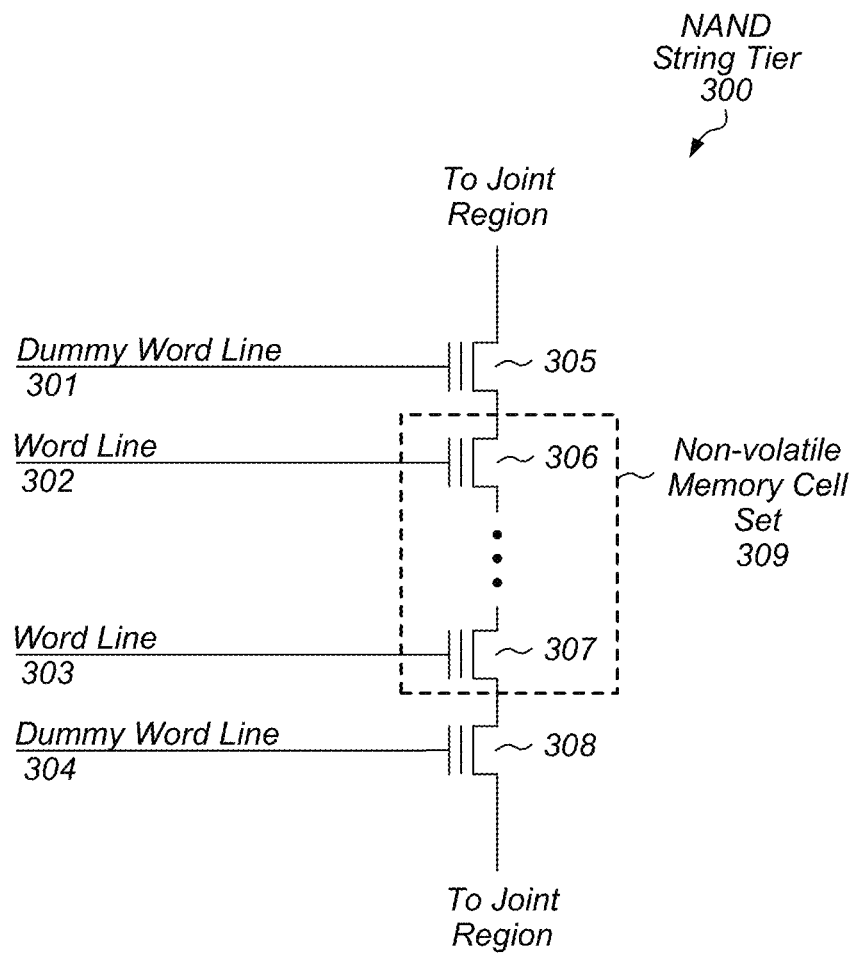
FIG. 3 illustrates a schematic diagram depicting an embodiment of a portion of a NAND string included in a non-volatile memory circuit.

To further illustrate the operation of a NAND string during an erase operation, a schematic representation of a portion (or "tier") of a NAND string is illustrated in FIG. 3. As illustrated, NAND string tier 300 includes dummy non-volatile memory cells 305 and 308, and non-volatile memory cell set 309. Non-volatile memory cell set 309 includes non-volatile memory cells 306-307. In various embodiments, non-volatile dummy memory cells 305 and 308, and non-volatile memory cells 306-307 may be particular embodiments of charge trap memory cells, floating gate memory cells, memristor memory cells, magnetoresistive memory cells, phase change memory cells, ferroelectric memory cells, and the like.

Dummy non-volatile memory cells 305 and 308 are coupled to respective joint regions, such as joint regions 160a and 160b, as illustrated in FIG. 1. In various embodiments, the threshold voltages of non-volatile memory cells 305 and 308 are left unprogrammed, i.e., the threshold voltages are at or near ground potential, so that the dummy devices are always conductive during read operations. During read or sense operations, dummy word line 301 and dummy word line 304 may be transitioned to a read voltage level to ensure dummy non-volatile memory cells 305 and 308 are in a conductive mode.

During erase operations, different voltage levels may be used for dummy word line 301 and dummy word line 304. As described below in more detail, in cases when a pre-erase operation is used, dummy word line 301 and dummy word line 304 may be floated. As used and described herein, "floating" refers to a state of a line in a circuit in which the line is not being driven to a particular voltage level. In some cases, even though a line is floating, there may be leakage currents that are sourced to or sunk from the line. During an erase operation subsequent to the pre-erase operation, dummy word line 301 and dummy word line 304 may be set to different voltage levels. The different voltage levels may be based on a distance of the dummy word line from a source line coupled to the NAND string. In some cases, the range of voltage levels used for dummy word lines may be different than the ranges of voltage levels used in erase operations for word lines and selection lines.

Each of non-volatile memory cells 306-307 included in non-volatile memory cell set 309 is configured to store one or more data bits based on a value of an electrical characteristic of the transistors. For example, in some cases, one electrical characteristic that may be employed is a threshold voltage associated with one of non-volatile memory cells 306-307. Different threshold voltage levels may correspond to different values of a data bit, or combination of data bits. Although only two non-volatile memory cells are depicted as being included in non-volatile memory cell set 309, in other embodiments, any suitable number of non-volatile memory cells may be employed.

The process of setting the threshold voltage of a non-volatile memory cell based on data bit(s) to be stored is referred to as programming. A particular one of non-volatile memory cells 306-307 may be programmed by applying a programming voltage to a corresponding one of word line signals 302-303 while a channel associated with non-volatile memory cells 306-307 is held at or near ground potential. Under such bias conditions, electrons can become trapped within an insulating (or "charge trap") layer included in the non-volatile memory cells, thereby setting threshold voltages for the non-volatile memory cells.

To retrieve previously programmed data from non-volatile memory cells 306-307, a selected one of word line signals 302-303 may be set of one of various possible threshold voltage values, while the remaining word line signals are set to a voltage level sufficiently high to enable their associated non-volatile memory cells and place them in a conductive mode. A determination may then be made if the voltage level applied to the selected word line has enabled its associated non-volatile memory cell. Such a determination may be made based on determining whether a conductive path is enabled through the NAND string. If the associated non-volatile memory cell is not enabled, the process may be repeated with different voltage levels applied to selected one of word lines 302-303 until a voltage level is found that enables the associated non-volatile memory cell, from which the value of the stored data can be inferred.

Figure 4:
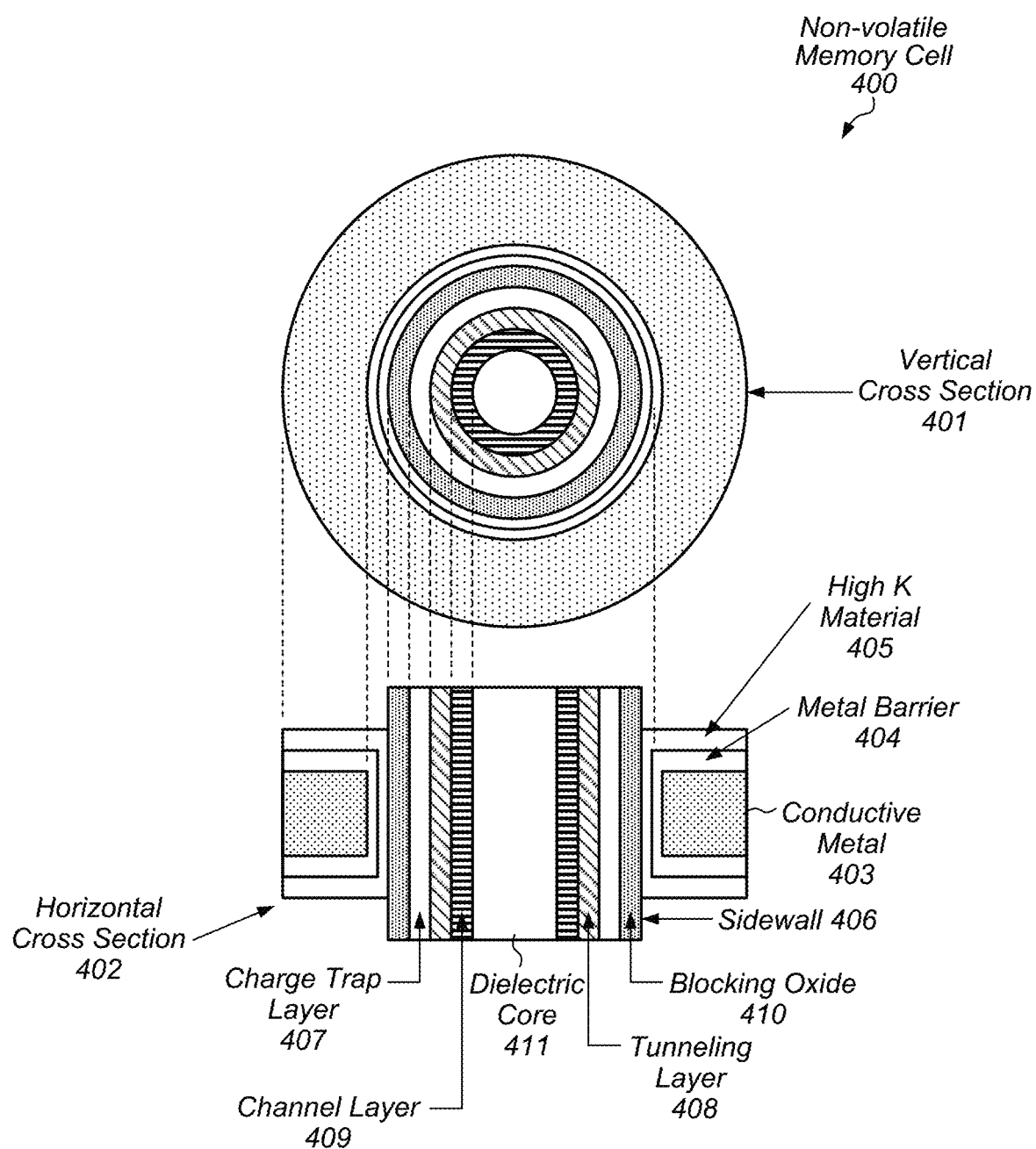
FIG. 4 illustrates a block diagram of a charge trap non-volatile memory cell.

Non-volatile memory cells, such as those described above, are formed at different levels of a NAND string at the intersection of layers including word lines or other control lines with the NAND string. Vertical and horizontal cross-sections of such a non-volatile memory cell are illustrated in FIG. 4. In various embodiments, non-volatile memory cell 400 may correspond to any of non-volatile memory cells 302 through 303 as depicted in FIG. 3. Non-volatile memory cell 400 includes various layers that may be deposited along sidewall 406 within a given word line layer using atomic layer deposition or any other suitable process. As illustrated in horizontal cross section 402, such layers include blocking oxide 410, charge trap layer 407, tunneling layer 408, channel layer 409, and dielectric core 411. In some embodiments, charge trap layer 407 may include silicon nitride (Si3N4) or other suitable nitride, and tunneling layer 408 may include any suitable oxide. Additionally, channel layer 409 may be composed of polysilicon. Although the embodiment depicted in FIG. 4 is described in relation to a non-volatile memory cell, similar layers and arrangements of layers may be used to fabricated selection gates, dummy non-volatile memory cells, or any other suitable devices included in a NAND string.

To connect a non-volatile memory cell to a word or other control line (e.g., one of dummy word lines 130), additional materials may be employed. As illustrated, high-k material 405, metal barrier 404, and conductive metal 403 (e.g., tungsten) may be used to couple a word or other control line to a non-volatile memory cell.

As shown in vertical cross section 401, each of the aforementioned layers are cylindrical in shape forming a set of concentric cylinders around dielectric core 411. In various embodiments, layers with word or control line metallization, alternating with dielectric layers may be fabricated on a substrate. Once the layers have been fabricated, holes may be etched, and the materials forming the non-volatile memory cells deposited within the holes forming the aforementioned concentric cylinders.

During a program operation performed on non-volatile memory cell 400, charge (e.g., one or more electrons) is trapped in a portion of charge trap layer 407 associated with non-volatile memory cell 400. Such charge is drawn into charge trap layer 407 from channel layer 409 and through tunneling layer 408. In some embodiments, to enable such charge trapping, a programming voltage level may be applied to conductive metal 403 while channel layer 409 is held at or near ground potential; this programming voltage level is sufficiently large in order allowing electron tunneling from channel layer 409 to charge trap layer 407. The number of trapped electrons, which determine a threshold voltage of the non-volatile memory cell 400, may be determined by the voltage level applied to control terminal 401 as well as a number of times the voltage level is applied to conductive metal 403.

The amount of charge trapped in charge trap layer 407 determines a threshold voltage for non-volatile memory cell 400. For example, the more charge that is trapped in charge trap layer 407, the higher the threshold voltage level of the memory cell device. In various embodiments, the threshold voltage may be set to one of multiple predetermined voltage levels, each of which corresponds to a particular data bit value or a value of a combination of multiple data bits During an erase operation, the trapped charge is drawn back into channel layer 409. In some cases, this may be accomplished be generating holes in channel layer 409. Electrons trapped in charge trap layer 407 migrate back through tunneling layer 408 to recombine with the generated holes. As the electrons vacate charge trap layer 409, the threshold voltage of non-volatile memory cell 400 is reset to a voltage at or near ground potential.

Once the threshold voltage of non-volatile memory cell 400 has been programmed, conduction through the memory cell device is based on a voltage level applied to conductive metal 403 as compared to the previously set threshold voltage. If the voltage level applied to conductive metal 403 is less than the previously set threshold voltage, non-volatile memory cell 400 will not conduct current. For example, the resistivity of a portion of channel layer 409 associate with non-volatile memory cell 400 may be high (possibly mega-ohms or higher), which prevents conduction through that portion of channel layer 409. Alternatively, if the voltage level applied to conductive metal 403 is greater than or equal to the previously set threshold voltage, then non-volatile memory cell 400 will conduct current. The difference in conductivity of non-volatile memory cell 400 when a voltage level is applied at a predetermined level to conductive metal 403 can be used together with sensing at what voltage level the non-volatile memory cell 400 conducts to determine the value of data bit(s) stored in non-volatile memory cell 400.

It is noted that the embodiment of FIG. 4 is merely an example. Many possible combinations of structures are materials may be used in fabricating selection gates included in three-dimensional non-volatile memory strings. For example, in some cases, the layered structure of insulating materials may include more than three layers, and the control terminal connection may be made from a nitride-based or other suitable material.

Figure 5:
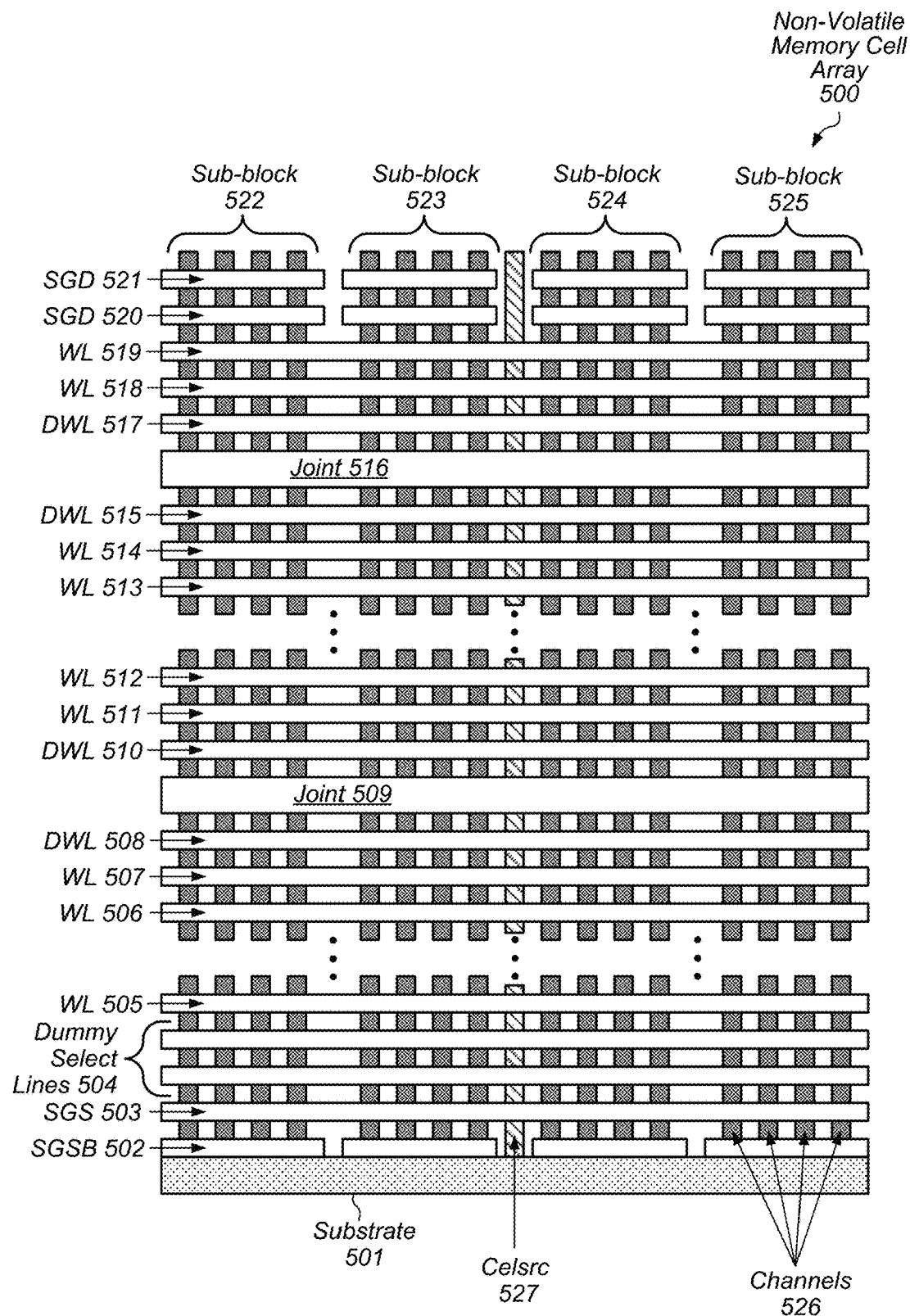
FIG. 5 illustrates a block diagram of NAND strings in a non-volatile memory.

During manufacture of a non-volatile memory circuit, multiple 3D NAND stings may be fabricated together to form an array of non-volatile memory cells, such as non-volatile memory cell array 120. To further illustrate the structure of a non-volatile memory cells array, a block diagram depicting a portion of a non-volatile is depicted in FIG. 5.

As illustrated, non-volatile memory array 500 is fabricated on substrate 501 and includes sub-blocks 522-525, and joints 509 and 516. Each of sub-blocks 522-525 includes multiple bit lines. For example, sub-block 525 includes channels 526. In various embodiments, an additional set of selection devices (not shown) may be coupled to each channel within a sub-block and controller by using separate control lines to allow for the selection of a particular one of the multiple channels included in the sub-block.

Non-volatile memory cells may be fabricated at the intersection of a bit line with any of a control line, word line, or dummy word line. For example, a non-volatile memory cells may be fabricated at the intersection of each of word lines WL 505-507, WL 511-514, and WL 518-519 and channels 526. It is noted that such non-volatile memory cells may have a similar structure to that described in regards to FIG. 4. Additionally, dummy non-volatile memory cells may be fabricated at the intersection of dummy word lines DWL 508, DWL 510, DWL 515, and DWL 517, and bit lines 526.

Selection gates (also referred to herein as "selection device" and which have a similar physical structure to non-volatile memory cells) may be fabricated at the intersection of control lines SGSB 502, SGS 503, SGD 520, and SGD 521, and channels 526. As used herein, a selection gate is a gate or device that couples the serially connected non-volatile memory cells to a bit line or source line. A selection gate that is coupled to a bit line is commonly referred to as a "select gate drain" device, while a selection gate that coupled to a source line is commonly referred to as a "select gate source" device. It is noted that although the above-description describes the manufacture of non-volatile memory cells or selection gates at the intersection of control lines, word lines, and dummy word lines, with channels 526, non-volatile memory cells or selection gates may also be fabricated at the intersection with bit lines in sub-blocks 522-525.

In order to provide an electrical connection to the substrate, which is connected to the body of non-volatile memory cells and selection gates included in non-volatile memory array 500, source line celsrc 527 is positioned between strings 523 and 524. Although only a single wire is depicted for source line celsrc 527, in other embodiments, multiple wires for source line celsrc 527 may be fabricated between other strings in non-volatile memory array 500 in order to maintain substrate 501 at a uniform potential during read or sense operations, as well as during erase operations.

As described above, joint regions are employed to overcome etch difficulties in creating the physical holes used to fabricate non-volatile memory cells as the intersection of a word line and a bit line. Non-volatile memory cell 500 includes joint 509 and 516. It is noted that although only two joint regions are depicted in non-volatile memory cell array 500, in other embodiments, any suitable number of joint regions may be employed. Each of the joint regions 509 and 516 is adjacent to dummy word lines. For example, joint 509 is adjacent to dummy word lines DWL 508 and 510, while joint 516 is adjacent to dummy word lines DWL 515 and 517.

During erase operations, each of dummy word lines DWL 508, 510, 515, and 517 may be set to different voltage levels to in order to recombine trapped charge carriers in or near joints 509 and 516. In some cases, the voltage levels of dummy word lines DWL 508, 510, 515, and 517 may depend on their respective distances from selection device SGSB 502. For example, the voltage level of dummy word line DWL 517 may be greater than the voltage level of dummy word line DWL 508.

In addition to dummy word lines coupled to dummy non-volatile memory cells, additional dummy devices and associated control lines may also be employed. For example, non-volatile memory array 500 includes dummy select lines 504 which are coupled to dummy non-volatile memory devices fabricated at the intersection of the dummy select lines 504 and the bit lines included in sub-blocks 522-525. In other embodiments, additional dummy selection lines, with associated dummy non-volatile memory devices, may be included near selection devices SGD 520 and 521.

Figure 6:
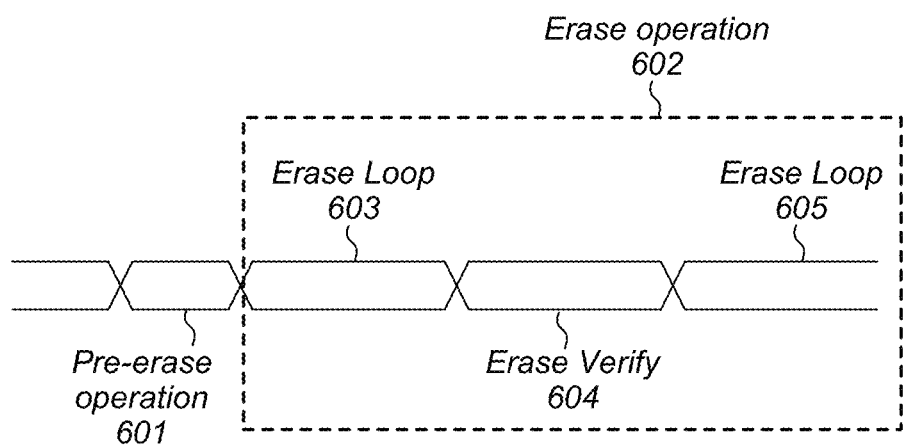
FIG. 6 illustrates a sample timing diagram of an erase operation of a non-volatile memory.

In addition to using different voltage levels on dummy word lines during erase operations, a two-phase erase operation may be employed. As used herein, a two-phase erase operation is an erase operation that includes two different phases (or sub-operations): an initial pre-erase phase followed by an erase phase. The pre-erase operation may be employed, either in lieu of, or in addition to, the different voltage levels on the dummy word lines to improve effectiveness of erase operations. A timing diagram depicting such a pre-erase phase is illustrated FIG. 6. As used herein, a pre-erase phase includes one or more actions, performed by a memory circuit or memory controller circuit, to facilitate or assist in improving effectiveness of an erase command received by the memory circuit or memory controller circuit. For example, a pre-erase phase may include setting word lines, dummy word lines, and source lines within a sub-block of a memory circuit to particular voltage levels to generate additional holes that are available for recombination with undesired trapped charge carriers.

As illustrated, prior to the start of erase operation 602, pre-erase phase 601 is performed. As described below in more detail, the various control lines (e.g., word lines, dummy word lines, source line, etc.) are floated or set to particular voltage levels. During pre-erase phase 601, charges trapped in joint regions or other areas, e.g., near a selection device, may be recombined in order to make erase phase 602 more efficient. It is noted that, in some embodiments, the use of the pre-erase phase 601 may be programmable. In such cases, the use of the pre-erase phase may be either enabled or disabled based on programmable control bits. Alternatively, a pre-erase phase may be enabled after a particular number of erase phases have been performed in order to limit any impact on performance that the extra time used to perform the pre-erase phase may incur.

Once pre-erase phase 601 has completed, erase phase 602 may begin. Erase phase 602 includes erase loop 603, erase verify 604, and erase loop 605. It is noted that although two erase loops and one erase verify as shown as being included in erase phase 602, in other embodiments, any suitable number or erase loops and erase verifies may be employed.

Each of erase loops 603 and 605 repeatedly apply a respective voltage levels to the word line, dummy word lines, and the source line within a NAND string. For example, as described above, each dummy word line may be set to a respective voltage level. The voltage levels are selected to draw charges trapped in charge trap layer 407 back into channel layer 409, thereby resetting the threshold voltage of non-volatile memory cells included in the NAND string to a voltage level at or near ground potential. In some cases, the charges trapped in charge trap layer are electrons. In order to draw the trapped electrons back into channel layer 409, holes are generated in channel layer 409. As the trapped electrons are drawn back into channel layer 409, the electrons recombine with the generated holes. Although the above description of erase loops 603 and 605 are described in reference to a charge trap non-volatile memory cell, in other embodiments, which use different types of non-volatile memory cells, different techniques may be employed when performing erase loops 603 and 605.

Erase verify 604 performs operations similar to a read operation, but applies a threshold voltage level at or near ground potential to a control terminal of a particular non-volatile memory cell included in the NAND string. By applying such a threshold voltage level, a sense circuit, e.g., sense circuit 812, can determine if the threshold voltage of the particular non-volatile memory has been reset to a voltage level at or near ground potential, thereby erasing the particular non-volatile memory cell. As erase verify 604 is performed, each non-volatile memory cell included in the NAND string is tested in this fashion. If there is at least one non-volatile memory cell included in the NAND string that does fully erase, i.e., its threshold voltage is still above the desired erase voltage level, then another erase loop (e.g., erase loop 605) is performed. Once the other erase loop has been completed, another erase verify may be performed where threshold voltages of each of the non-volatile memory cells in the NAND string are checked.

It is noted that erase verify 604 is described in the context of a charge trap non-volatile memory cell. In other embodiments, erase verify 604 may include other steps or operations that are particular to reading other types of non-volatile memory cells.

Figure 7:
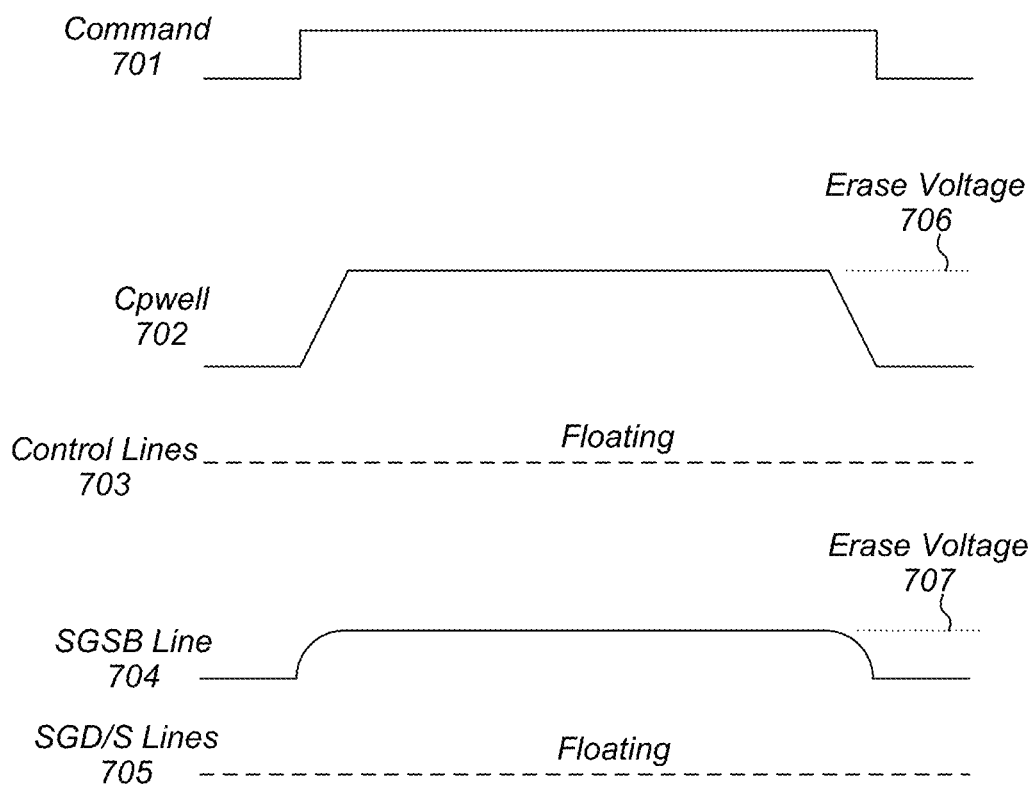
FIG. 7 illustrates example waveforms of signals used during an erase operation of a non-volatile memory.

As described above, erasing a portion of a non-volatile memory circuit may include performing a pre-erase phase. An example of waveforms associated with the pre-erase phase as illustrated in FIG. 7.

As illustrated, the pre-erase phase is initiated with command 701 being asserted to a high logic level. In conjunction with command 701 being asserted, the voltage level of the channel associated with non-volatile memory cells in a particular NAND string (denoted by "cpwell 702") is transitioned to erase voltage 706. Erase voltage 706 may, in various embodiments, be sufficiently large to draw trapped carriers from a layer in which they are trapped into the channel.

Additionally, control lines 703 may be transitioned to, or left in, a floating state. Control lines, as used herein, may refer to various lines coupled to non-volatile memory cells included in a NAND string of a non-volatile memory. As noted previously, control lines may include selection lines coupled to selection device, word lines coupled to non-volatile memory cells, and dummy word lines coupled to dummy non-volatile memory cells.

As the pre-erase cycle is initiated, the source line (denoted as "SGSB line 704") is set to erase voltage 707. In various embodiments, erase voltage 707 may be sufficiently large to allow trapped carriers to be recombined. For example, in some cases erase voltage 707 may be between 2 to 3 volts. In some embodiments, the value of erase voltage 707 may be programmable to allow for different voltage levels to be used based on results of previous erase operations.

Lastly, selection lines (denoted as "SGD/S lines 705") are also placed in a floating state. In various embodiments, the SGD/S lines are floated in order to minimize any disturb effects on the selection gate (or devices) that couple the serially-connected non-volatile memory cells to a bit line and a source line.

After a particular time period has elapsed, command 701 is returned to a logic low level signifying the end of the pre-erase operation. As the pre-erase operation ends, cpwell 702 is transitioned back to ground potential along with SGSB line 704. Control lines 703 and SGD/S lines 705 may remain in a floating state, ready for a new operation, such as a read operation.

Figure 8:
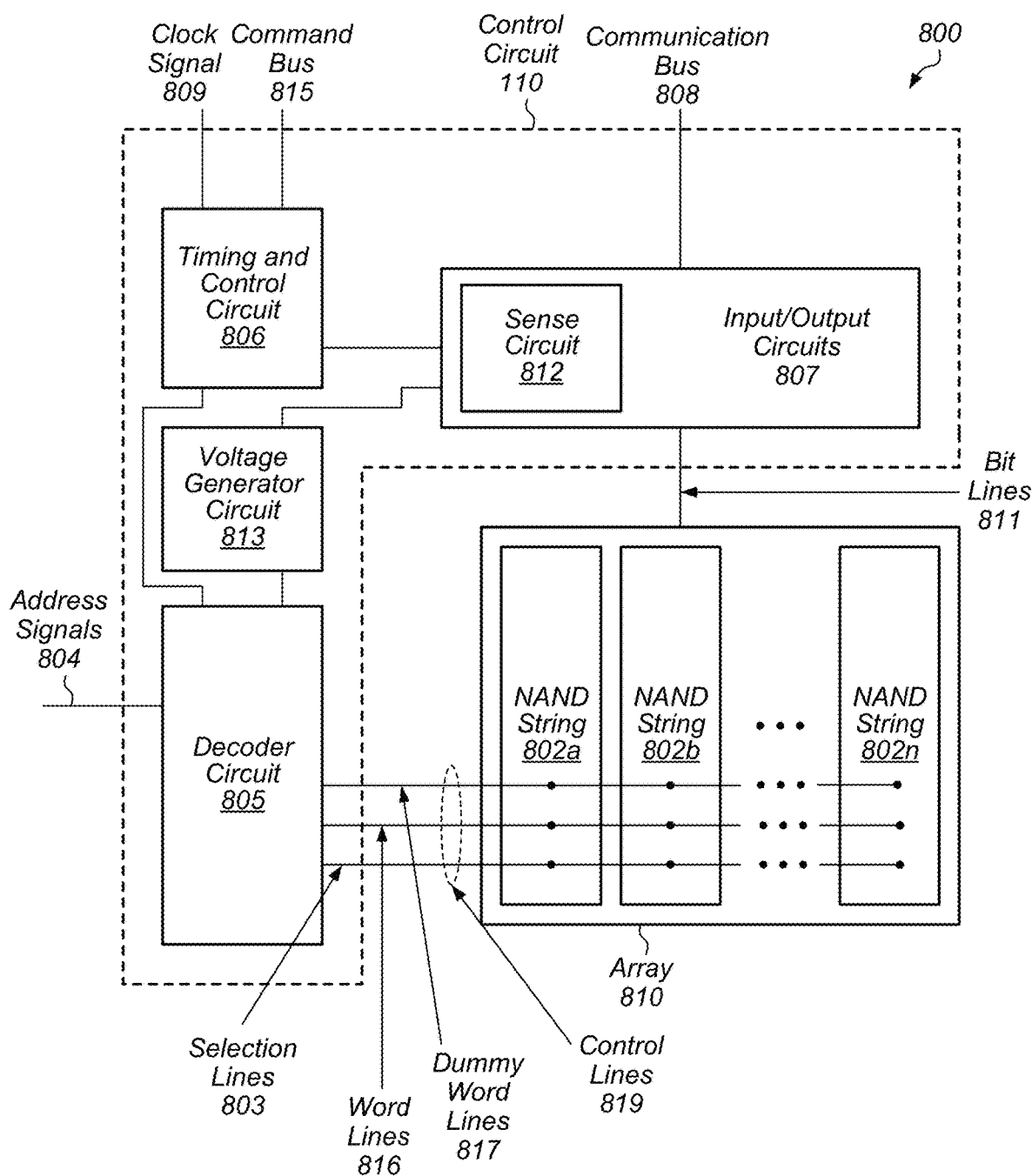
FIG. 8 illustrates a block diagram of an embodiment of a non-volatile memory circuit.

Turning to FIG. 8, an embodiment of a non-volatile memory circuit 800 is shown that includes array 810 and control circuit 110. Array 810 includes NAND strings 802a-802n, and control circuit 110 includes timing circuit 806, input/output circuits 807, voltage generator circuit 813, and decoder circuit 805. These components are exemplary and are provided to generally describe operation of circuit 800.

In various embodiments, each of NAND strings 802a-802n may correspond to NAND string 200 as illustrated in FIG. 2 and may include multiple memory cells along with one or more selection gates and joint regions. Although three NAND strings are depicted in the embodiment of FIG. 8, in other embodiments, any suitable number of NAND strings may be included in array 810.

As described above, charge may become trapped in portions of one or more of NAND strings 802a-802n that is not included in a non-volatile memory cell. Such charge may inhibit proper erasing of non-volatile memory cells in NAND strings 802a-802n. To assist in erasing non-volatile memory cells in NAND strings 802a-802n, timing and control circuit 806 may initiate a pre-erase cycle, using clock signal 809, in response to receiving an erase command via command bus 815. As noted above, during the pre-erase cycle, the aforementioned trapped charge may be released, thereby providing an increased number of holes during the subsequent erase cycle to allow for proper erasure of the non-volatile memory cells in the selected NAND string.

Timing and control circuit 806 may be a particular embodiment of a state machine or sequential logic circuit and may be implemented according to one of various design cycles. In various embodiments, timing and control circuit 806 may be configured to generate signals that change the voltage levels of various ones of control lines 819 as illustrated in FIG. 7 above. Additionally, timing and control circuit 806 may generate internal timing signals based on clock signal 809 that are used during sense operations to verify non-volatile memory cells have been adequately erased.

Decoder circuit 805 is configured to receive and decode address signals 804. Based on a decode of address signals 804, decoder circuit 805 may set voltage levels of selection lines 803, word lines 816, and dummy word lines 817 (collectively control lines 819) to erase one or more NAND strings as part of an erase operation. For example, during the erase operation, decoder circuit 805 may use voltage levels generated by voltage generator circuit 813 to set different ones of dummy word lines 817 to respective voltage levels. By setting dummy word lines 817 to respective voltage levels during an erase operation, trapped charges in and near joint regions in a particular NAND string may be recombined, thereby making additional holes available for carrier recombination within the charge trap layers of non-volatile memory cells in the particular NAND string.

Voltage generator circuit 813 is configured to generate one or more voltage levels used during selection, programming, and erasing of non-volatile memory cells and dummy non-volatile memory cells included in NAND strings 802a-802n. In various embodiments, voltage generator circuit 813 includes charge pumps, voltage regulator circuits, and any other suitable circuit capable of generating a particular voltage level using a power supply signal.

Input/output circuits 807 are configured to receive data from and transmit data via communication bus 808. In various embodiments, input/output circuits 807 may include data input latch circuits, output driver circuits, voltage level shifter circuits, and the like (all of which are not shown for clarity).

In addition to receiving and sending data, input/output circuits 807 are also configured to determine data stored in memory cell devices included in NAND strings 802a-802n using bit lines 811. Input/output circuits 807 includes sense circuit 812, which is used to verify a particular non-volatile memory cell has been adequately erased. In some embodiments, sense circuit 812 is configured to compare a voltage level of a particular one of bit lines 811 to a reference voltage level indicative of an erase non-volatile memory cell.

Figure 9:
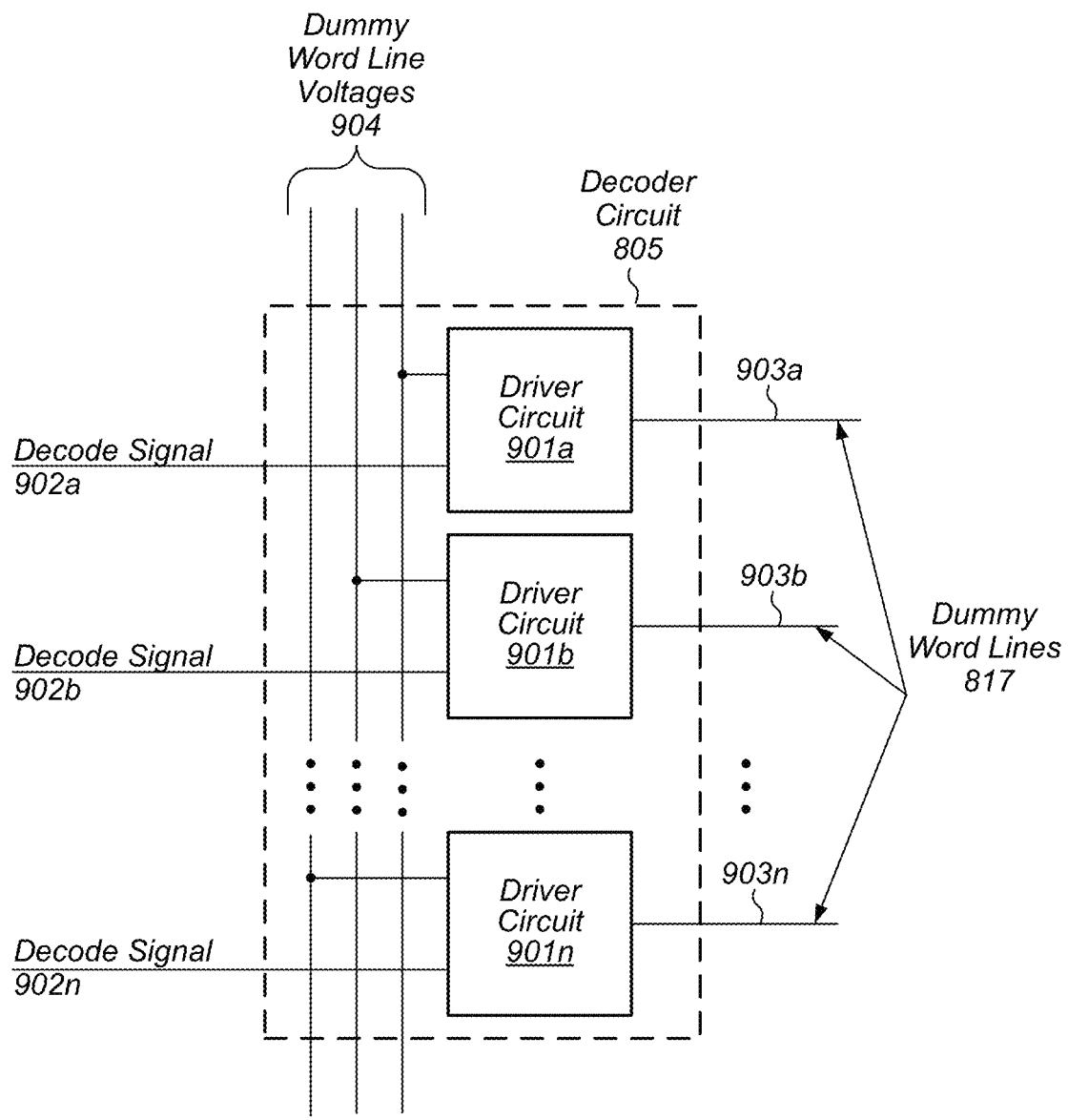
FIG. 9 illustrates a block diagram of a decoder circuit.

As described above, different dummy word lines may have different voltage levels during erase operations in order to recombine trapped charges near joint regions in a NAND string. Such different voltage levels may be generated and distributed to the various dummy word lines in a variety of fashions. A particular technique is illustrated in the embodiment of decoder circuit 805 is depicted in FIG. 9.

As illustrated, decoder circuit 805 includes driver circuits 801a-801n, coupled to dummy word lines, 903a-903n, respectively. Additionally, driver circuit 901 is coupled to decode signal 902a, driver circuit 901b is coupled to decode signal 902n. It is noted that although only three driver circuits are depicted in the embodiment illustrated in FIG. 9, in other embodiments, any suitable number of driver circuits may be employed.

Each of driver circuits 901a-901n is configured, during an erase operation, to pass a respective voltage level from dummy word line voltages 904 to a corresponding one of dummy word lines 903a-903n. In various embodiments, driver circuits 901a-901n may employ pass transistors, other suitable circuit elements, to couple dummy word lines 903a-903n to corresponding ones of dummy word line voltages 904. In some embodiments, the coupling action may be triggered by particular voltage levels on decoder signals 902a-902n. For example, a high logic level on decoder signal 902a may cause driver circuit 901a to couple dummy word line 903a to a particular one of dummy word line voltages 904. As used and described herein, a high logic level (or simply a "high") refers to a voltage level sufficient to enable an n-channel MOSFET, and a low logic level (or simply a "low") is a voltage level at or near ground potential. In other embodiments, technologies other than complementary metal-oxide semiconductor (CMOS) may be used, resulting in other voltage levels for the high logic level and the low logic level.

The activation of decoder signals 902a-902n may be based on address and timing information, such as address signals 804 and clock signal 809. In various embodiments, the voltage level to which a particular one of dummy word lines 903a-903n is transitioned during an erase operation may depend on a distance between the particular one of dummy word lines 903a-903n and a source line coupled to the NAND string. Alternatively, or additionally, the voltage level for the particular one of dummy word lines 903a-903n may be programmable, such as by storing a particular combination of data bit values in a register or other suitable storage circuit.

Figure 10:
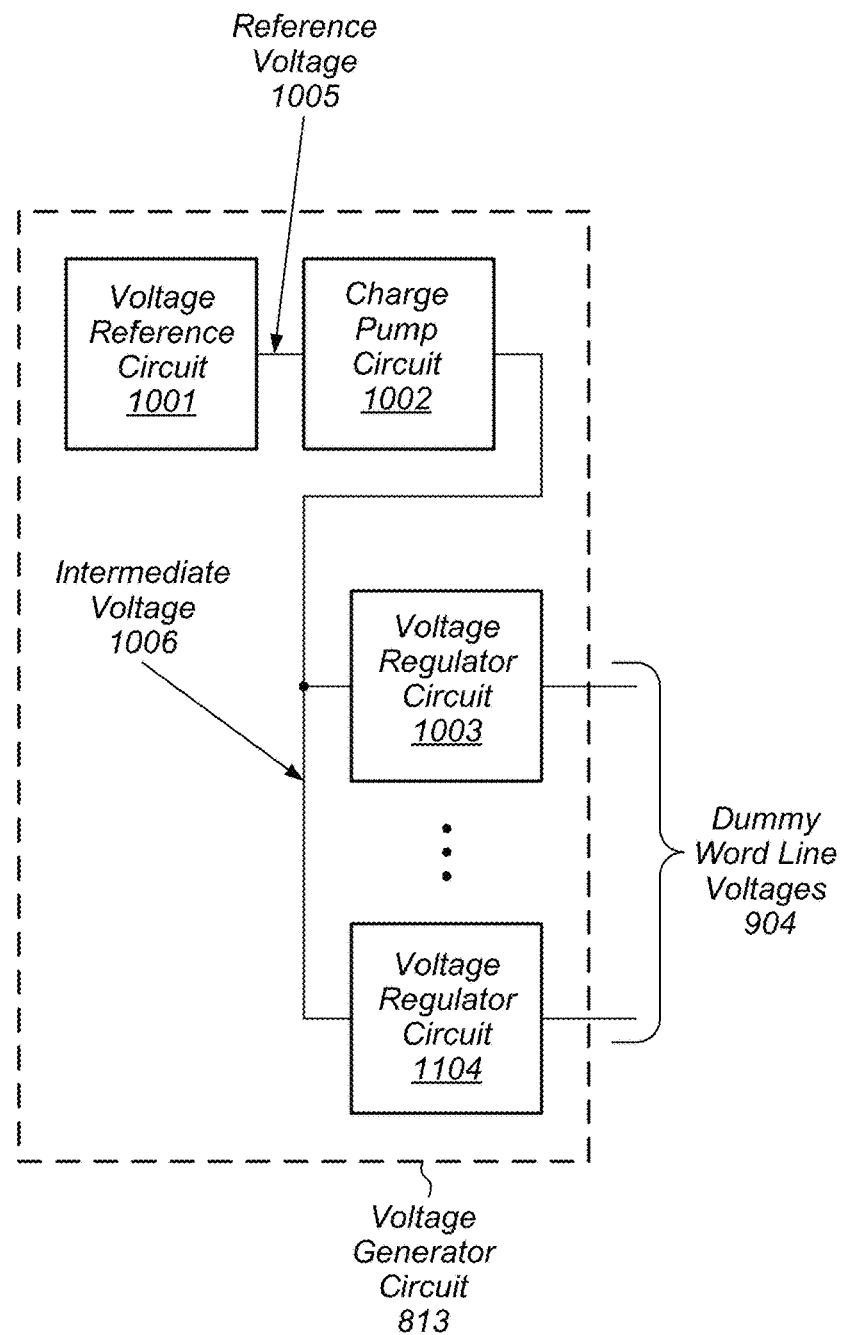
FIG. 10 illustrates a block diagram of a voltage generation circuit.

Turning to FIG. 10, an embodiment of voltage generator circuits 813 is depicted. As illustrated voltage generator circuit 813 includes voltage reference circuit 1001, charge pump circuit 1002, and voltage regulator circuits 1003-1004. It is noted that although only two voltage regulator circuits are shown in the embodiment of FIG. 10, in other embodiments, any suitable number of voltage regulator circuits may be employed.

Voltage reference circuit 1001 is configured to generate reference voltage 1005. In various embodiments, voltage reference circuit 1001 may include a bandgap reference circuit or any other suitable circuit configured to generate a power supply and temperature-independent reference voltage level.

Charge pump circuit 1002 is configured to generate intermediate voltage level 1006. In some cases, charge pump circuit 1002 may selectively apply or remove charge to the intermediate voltage 1006 to create a voltage greater than or less than the voltage level of reference voltage 1005. In various embodiments, charge pump circuit 1002 may include a comparator circuit configured to compare the voltage level of intermediate voltage 1006 to reference voltage 1005.

Each of voltage regulator circuits 1003-1004 is configured to generate a respective one of dummy word line voltages 904, each of which is regulated. As used herein, a regulated voltage is a voltage whose values remains with a predefined range of a desired value. In various embodiments, each of voltage regulator circuits 1003-1004 include a comparator circuit configured to compare a voltage level of a corresponding one of dummy word line voltages 904 to a voltage level of intermediate voltage 1006. In some cases, each of dummy word line voltages 904 may be different. The level of a particular one of dummy word line voltages 904 may be programmable by storing one or more data bits in a register or other suitable circuit (not shown) included in voltage generator circuit 813.

Although depicted as being included in non-volatile memory circuit, in some cases voltage generator circuit 813 may be external to a non-volatile memory circuit. In some embodiments, voltage generator circuit 813 may be shared among multiple non-volatile memory circuits.

Figure 11:
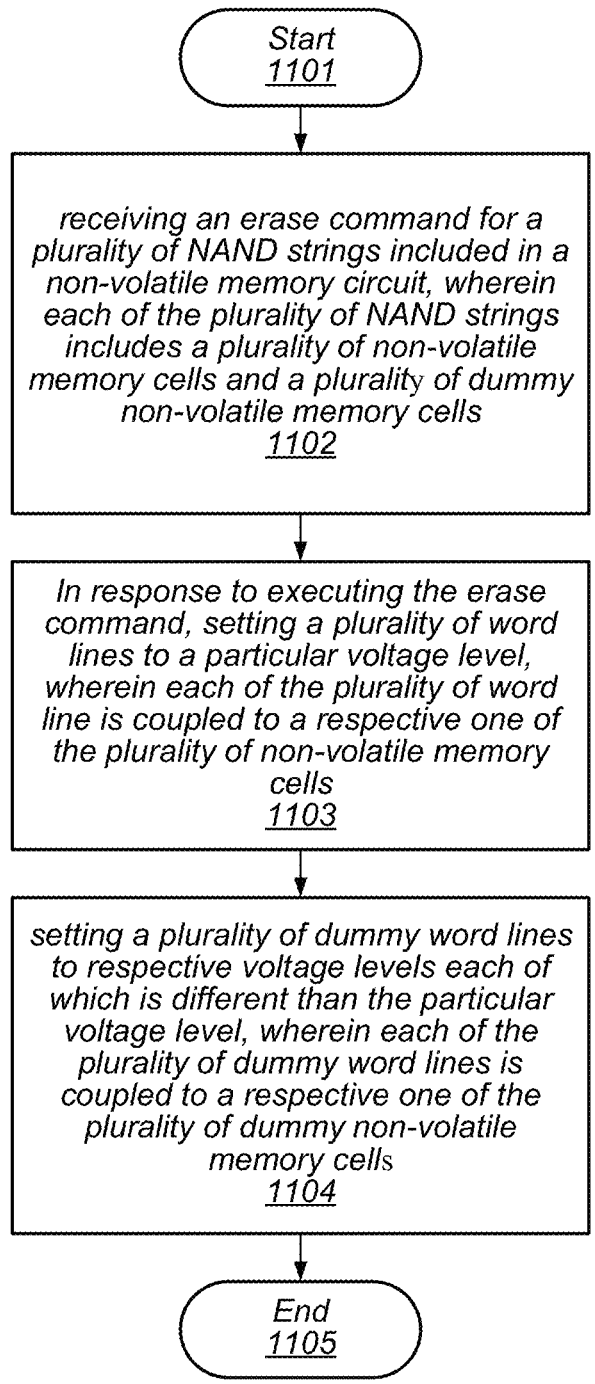
FIG. 11 illustrates a flow diagram depicting an embodiment of a method for performing an erase operation in a non-volatile memory circuit.

A flow diagram illustrating an embodiment of a method for erasing a non-volatile memory circuit is depicted in FIG. 11. The method, which begins in block 1101, may be applied to non-volatile memory circuit 100, non-volatile memory circuit 800, or any other suitable non-volatile memory circuit configured to operate in a similar fashion.

The method includes receiving an erase command for a plurality of NAND strings includes in a non-volatile memory, where each of the plurality of NAND strings includes a plurality of non-volatile memory cells and a plurality of dummy non-volatile memory cells (block 1101). In various embodiments, the voltage level of a particular dummy word line is based on, in part, a distance from a corresponding dummy non-volatile memory cell and a selection device included in the particular one of the plurality of NAND strings. The selection device may, in some cases, be coupled to a bit line included in the non-volatile memory circuit. It is noted that, in some embodiments, information indicative of the distance is encoded in a plurality of data bits.

In response to executing the erase command, the method also includes setting a plurality of word lines to a particular voltage level, wherein each of the plurality of word line is coupled to a respective one of the plurality of non-volatile memory cells (block 1102).

Also, in response to executing the erase command, the method includes a plurality of dummy word lines to respective voltage levels each, of which, is different than the particular voltage level, wherein each of the plurality of dummy word lines is coupled to a respective one of the plurality of dummy non-volatile memory cells (block 1103). As described above in more detail, each one of the plurality of dummy non-volatile memory cells is adjacent to a particular one of a plurality of joint regions included in the particular one of the plurality of NAND strings. In some embodiments, each of the respective voltage levels is less than the particular voltage level. The method concludes in block 1104.

Figure 12:
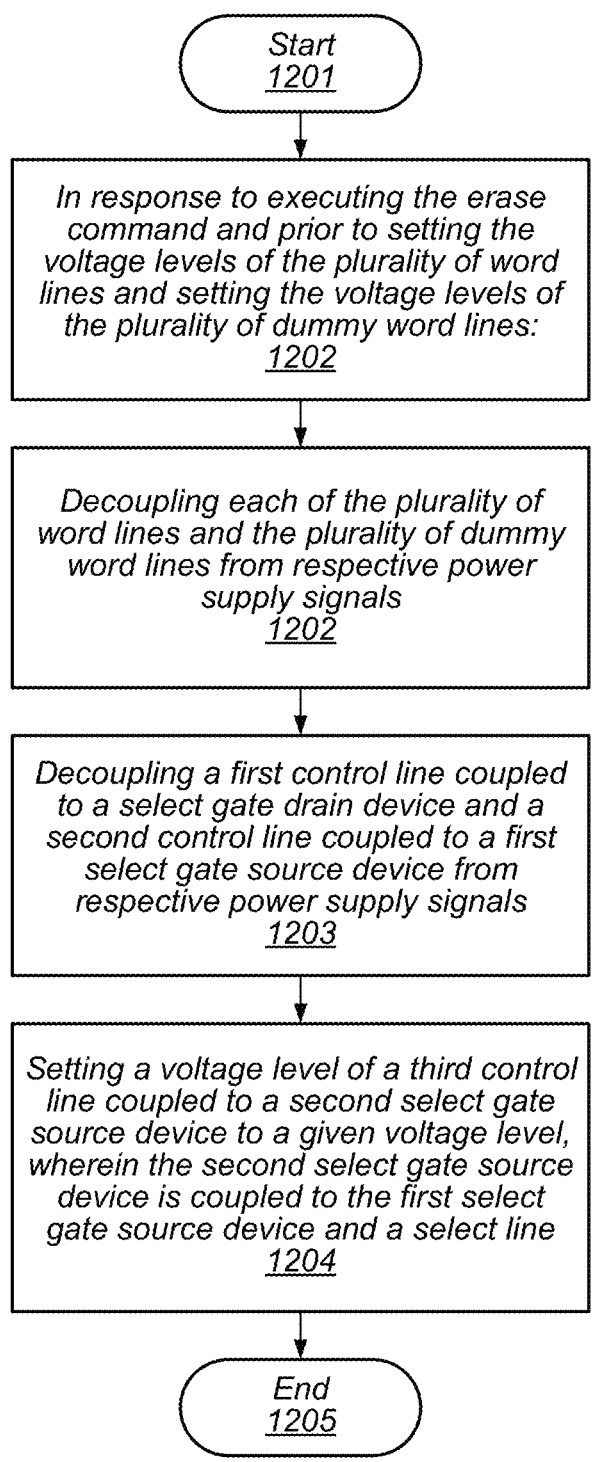
FIG. 12 illustrates a flow diagram depicting an embodiment of another method for performing an erase operation in a non-volatile memory circuit.

A flow diagram illustrating another embodiment of a method for erasing a non-volatile memory circuit is depicted in FIG. 12. The method, which begins in block 1201, may be applied to non-volatile memory circuit 100, non-volatile memory circuit 800, or any other suitable non-volatile memory circuit configured to operate in a similar fashion.

It is noted that the method depicted in the flow diagram of FIG. 12 may be used in conjunction with the method depicted in the flow diagram of FIG. 11. In such cases, in response to executing the erase command and prior to setting the plurality of word lines and setting the plurality of dummy word lines, the method includes decoupling each of the plurality of word lines and the plurality of dummy word lines from respective power supply signals (block 1202).

In some embodiments, the method further includes, setting, after a period of time has elapsed since the plurality of word lines were decoupled from the respective power supply signals, the voltage levels of the plurality of word lines and the voltage levels of the plurality of dummy word lines to ground potential prior to continuing with executing the erase command.

The method also includes decoupling a first control line coupled to a select gate drain device and a second control line coupled to a first select gate source device from respective power supply signals (block 1203).

The method further includes setting a voltage level of a third control line coupled to a second select gate source device to a given voltage level, wherein the second select gate source device is coupled to the first select gate source device and a select line (block 1204). The method concludes in block 1205.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a plurality of NAND strings each NAND string coupled to a source line and including:
   a plurality of non-volatile memory cells;
   a joint region positioned between ends of the NAND strings;
   a selection device coupled to the source line and a bit line; and
   a plurality of dummy non-volatile memory cells each adjacent to the joint region; and
   a control circuit configured to set a plurality of dummy word lines to different voltage levels as part of executing an erase command, wherein each of the plurality of dummy word lines is coupled to a respective one of the plurality of dummy non-volatile memory cells, and to select voltage levels for each particular dummy word line based on a distance from a corresponding dummy non-volatile memory cell coupled to the particular dummy word line to the selection device, wherein the selected voltage level is greater as the distance is greater.

2. The apparatus of claim 1, wherein to select the voltage level for each particular dummy word line, the control circuit is further configured to decode a plurality of previously programmed data bits associated with the particular dummy word line, wherein a value for the voltage level for the particular dummy word line is encoded in the plurality of previously programmed data bits.

3. The apparatus of claim 1, wherein the control circuit is further configured to set a plurality of word lines to a particular voltage level greater than each of the respective voltage levels of the dummy word lines, wherein each of the plurality of word lines is coupled to a respective one of the plurality of non-volatile memory cells.

4. The apparatus of claim 3, wherein the control circuit is further configured to, prior to setting the plurality of dummy word lines to the respective voltage levels:
   float each of the plurality of word lines and each of the plurality of dummy word lines;
   float first and second control lines coupled to a select gate drain device and a select gate source device, respectively, wherein the select gate drain device is coupled to a bit line coupled to the NAND string, and the select gate source device is coupled to a different select gate source device; and
   set a voltage level of a third control line coupled to the different select gate source device to a given voltage level, wherein the different select gate source device is coupled to the source line.

5. The apparatus of claim 4, wherein the control circuit is further configured, after a period of time has elapsed since the plurality of word lines were floated, to set the plurality of word lines and the plurality of dummy word lines to ground.

6. A method, comprising:
   receiving an erase command for a plurality of NAND strings included in a non-volatile memory circuit, wherein each NAND string includes a plurality of non-volatile memory cells and a plurality of dummy non-volatile memory cells; and executing the erase command, at least in part by:
setting a plurality of word lines to a particular voltage level, wherein each word line of the plurality of word lines is coupled to a respective one of the plurality of non-volatile memory cells; and setting a plurality of dummy word lines to respective voltage levels each of which is different from the particular voltage level, wherein each of the plurality of dummy word lines is coupled to a respective one of the plurality of dummy non-volatile memory cells, wherein a voltage level of each particular dummy word line is based on a distance from a corresponding dummy non-volatile memory cell coupled to the particular dummy word line to a selection device included in the particular one of the plurality of NAND strings, wherein the voltage level of each particular dummy word line is greater as the distance is greater.

7. The method of claim 6, wherein the selection device included in the particular one of the plurality of NAND strings is coupled to a bit line.

8. The method of claim 7, wherein information indicative of the distance is encoded in a plurality of data bits previously programmed in a register included in the non-volatile memory circuit.

9. The method of claim 6, further comprising, in response to executing the erase command and prior to setting the plurality of word lines to the particular voltage level and setting the plurality of dummy word lines to the respective voltage levels:

decoupling each of the plurality of word lines and the plurality of dummy word lines from respective power supply signals;

decoupling a first control line coupled to a select gate drain device and a second control line coupled to a first select gate source device from respective power supply signals; and setting a voltage level of a third control line coupled to a second select gate source device to a given voltage level, wherein the second select gate source device is coupled to the first select gate source device and a select line.

10. The method of claim 9, further comprising, setting, after a period of time has elapsed since the plurality of word lines were decoupled from the respective power supply signals, the plurality of word lines and the plurality of dummy word lines to ground potential prior to continuing with executing the erase command.

11. The method of claim 6, wherein the each of the respective voltage levels is less than the particular voltage level.

12. The method of claim 6, wherein each one of the plurality of dummy non-volatile memory cells is adjacent to a particular one of a plurality of joint regions included in the particular one of the plurality of NAND strings.

13. A system, comprising:
a plurality of non-volatile memory cell strings including a non-volatile memory cell string that includes a plurality of dummy non-volatile memory cells and a plurality of joint regions adjacent to the plurality of dummy non-volatile memory cells, and separating sets of non-volatile memory cells, wherein each set is coupled to a plurality of word lines;

a control circuit configured to
receive an erase command; and
initiate a two-phase erase operation of a particular non-volatile memory cell string of the plurality of non-volatile memory cell strings, wherein an initial phase of the two-phase erase operation includes a pre-erase phase and a subsequent phase includes at least one erase phase; and reduce a number of trapped charge carriers in the particular non-volatile memory cell string by setting a plurality of dummy word lines to respective voltage levels in response to the erase operation included in the subsequent phase, wherein each of the plurality of dummy word lines is coupled to a respective one of the plurality of dummy non-volatile memory cells.

14. The system of claim 13, wherein non-volatile memory cell string further includes a selection device coupled to a bit line, and wherein the control circuit is further configured to select a voltage level for a particular dummy word line based on a distance from a corresponding dummy non-volatile memory cell coupled to the particular dummy word line to the selection device.

15. The system of claim 14, further comprising a register configured to store a plurality of data bits including a subset of the plurality of data bits that whose values are indicative of a voltage level of the particular dummy word line to be used during the erase operation included in the subsequent phase, and wherein to select the voltage level for the particular dummy word line, the control circuit is further configured to decode the subset of the plurality of data bits.

16. The system of claim 13, wherein each dummy non-volatile memory cell is adjacent to a joint region of the particular non-volatile memory cell string.

17. The system of claim 13, wherein the control circuit is further configured, in response to the erase phase, to set a plurality of word lines to a particular voltage level greater than each of the respective voltage levels, wherein each of the plurality of word lines is coupled to a respective one of a plurality of non-volatile memory cells.

18. The system of claim 17, wherein the control circuit is further configured, in response to the pre-erase phase, to:
float each of the plurality of word lines and each of the plurality of dummy word lines;
float first and second control lines coupled to a select gate drain device and a select gate source device, respectively, wherein the select gate drain device is coupled to a bit line coupled to the particular non-volatile memory cell string, and the select gate source device is coupled to a different select gate source device; and
set a voltage level of a third control line coupled to the different select gate source device to a given voltage level, wherein the different select gate source device is coupled to a source line.

19. The system of claim 18, wherein the control circuit is further configured, in response to a determination a particular period of time has elapsed since the pre-erase phase was initiated, to pre-charge the plurality of word lines, the plurality of dummy word lines, and the first, second, and third control lines.

* * * * *